United States Patent
Li et al.

(10) Patent No.: US 6,551,112 B1
(45) Date of Patent: Apr. 22, 2003

(54) TEST AND BURN-IN CONNECTOR

(75) Inventors: Che-Yu Li, Ithica, NY (US); Zhineng Fan, Sunnyvale, CA (US); Linh Van, Fremont, CA (US)

(73) Assignee: High Connection Density, Inc., Sunnyvale, CA (US)

( * ) Notice: Subject to any disclaimer, the term of this patent is extended or adjusted under 35 U.S.C. 154(b) by 0 days.

(21) Appl. No.: 10/100,667

(22) Filed: Mar. 18, 2002

(51) Int. Cl.[7] .............................................. H01R 12/00
(52) U.S. Cl. ......................................... 439/66; 439/71
(58) Field of Search ........................... 439/66, 65, 55, 439/245, 70, 71, 78, 79, 80

(56) References Cited

U.S. PATENT DOCUMENTS

| | | | |
|---|---|---|---|
| 5,241,133 A | 8/1993 | Mullen, III et al. | 174/52.4 |
| 5,273,438 A * | 12/1993 | Bradley et al. | 29/884 |
| 5,355,283 A | 10/1994 | Marrs et al. | 361/760 |
| 5,420,460 A | 5/1995 | Massingill | 257/693 |
| 5,791,914 A | 8/1998 | Loranger et al. | 439/71 |
| 6,095,823 A * | 8/2000 | Banks | 439/66 |
| 6,174,174 B1 * | 1/2001 | Suzuki et al. | 439/66 |
| 6,229,320 B1 | 5/2001 | Haseyama et al. | 324/754 |
| 6,264,476 B1 * | 7/2001 | Li et al. | 439/66 |
| 6,267,603 B1 | 7/2001 | Yamamoto et al. | 439/70 |
| 6,276,949 B1 | 8/2001 | Nakano et al. | 439/159 |
| 6,287,126 B1 * | 9/2001 | Berger et al. | 439/65 |
| 6,307,394 B1 | 10/2001 | Farnworth et al. | 324/765 |
| 6,313,523 B1 * | 11/2001 | Morris et al. | 257/690 |
| 6,314,639 B1 | 11/2001 | Corisis | 29/827 |
| 6,320,397 B1 | 11/2001 | Wood et al. | 324/755 |
| 6,329,637 B1 | 12/2001 | Hembree et al. | 219/209 |
| 6,330,164 B1 | 12/2001 | Khandros et al. | 361/760 |
| 6,375,475 B1 * | 4/2002 | Brodsky | 439/66 |
| 6,386,890 B1 * | 5/2002 | Bhatt et al. | 439/66 |

* cited by examiner

*Primary Examiner*—Tho D. Ta
*Assistant Examiner*—Edwin A. León
(74) *Attorney, Agent, or Firm*—Duane Morris LLP (57) ABSTRACT

An interconnection device is provided for temporary connection of a first electronic system to a second electronic system having a support substrate that includes an ordered array of conductive solder pads. A plurality of coil signal contacts are mounted to the conductive solder pads. Each one of the coil signal contacts comprises a central longitudinal axis, a top turn and a bottom turn that are arranged in spaced relation to one another. In this way, the bottom turn of one of the plurality of coil signal contacts is fastened to each of the conductive pads such that the top turns are spaced away from the support substrate.

14 Claims, 10 Drawing Sheets

TEST AND BURN-IN CONNECTOR

FIELD OF THE INVENTION

The present invention relates to techniques and assemblies for making electrical interconnections to contact elements on a semiconductor device during a temporary connection to the device, i.e. in test and/or burn-in procedures.

BACKGROUND OF THE INVENTION

Rapid advances in microelectronic devices are continuously demanding finer pitch connections between electronic chip carriers and printed circuit boards (on the order of a few hundred micrometer pitch or less). This demand as well as the demand for low cost electronic packages have led to the increased use of surface mount technology (SMT) over the conventional plated-through-hole (PTH) technology in the recent years. At present, more than two thirds of integrated circuits (IC) including both memory and logic devices are assembled by SMT. SMT packages commonly found in a printed circuit board (PCB) assembly are leaded chip carriers such as small outline integrated circuits (SOIC), plastic leaded chip carrier (PLCC), quad flat pack (QFP), thin small outline package (TSOP), or tape carrier package (TCP). These leaded chip carriers depend upon a perimeter connection between an IC package and a PCB. The perimeter connection scheme of SMT packages has reached its limitation in terms of connection pitch and I/O capability, particularly for high performance IC's.

To relieve the limitations of perimeter connections and thereby to increase the packaging density, area array connection and packaging schemes have become popular. Some of the area array packages developed for SMT include the ball grid array (BGA) package, solder column grid array (SCGA), direct chip attach (DCA) to PCB by flip chip connection, tape ball grid array (TBGA), and chip scale packages (CSP). A typical BGA array has a pitch in the 40–50 mil range, while for the CSP arrays the pitch may go down to 15 mils. Among them, BGA is currently the most popular one, where solder balls connect a module carrying an IC to a PCB. This technology is an extension of the controlled collapse chip connection (C4) scheme originally developed for solder bump connection of multiple chips to a ceramic substrate.

The IC on the module can be connected to the module in several ways as taught by Mulles et al., U.S. Pat. No. 5,241,133; Massingill, U.S. Pat. No. 5,420,460; and Marrs et al., U.S. Pat. No. 5,355,283 among others. Ceramic or organic module substrates can be employed depending on the performance, weight and other requirements. The common feature, however, is that the connection between the IC carrier and the next level PCB is accomplished by an array of solder balls which are attached to the module by a solder alloy with a lower melting temperature.

Semiconductor components, such as bare dice, or chip scale and BGA packages, must be tested prior to shipment by semiconductor manufacturers. Since these components are relatively small and fragile, carriers have been developed for handling the components for testing. The carriers permit electrical connections to be made between external contacts on the components, and testing equipment such as burn-in boards. On bare dice, the external contacts typically comprise planar or bumped bond pads. On chip scale packages, the external contacts typically comprise solder balls in a dense array, such as a ball grid array, or a fine ball grid array.

A significant problem associated with BGA modules is the difficulty associated with testing and "burning-in" the assembly after a silicon die has been assembled on them. Although the die may have been tested prior to BGA assembly, the devices and circuitry have to be retested because of the additional temperature and handling exposures involved in the BGA and other assembly procedures. This poses a problem because the only way to access the chip devices is through the BGA balls. Establishing reliable contact for testing and burn-in has been difficult when using prior art testing and burn-in devices that are often designed for engaging pin grid array modules. Even if alternate means could be designed to contact the BGA balls, these would most likely require mechanical pressure of pads or "bed-of-nails" type pin arrays on a test board to be pressed against the solder balls. These approaches are often unreliable due to the softness of the BGA balls and the tenacious oxide present on their surface. Additionally, the application of pressure during the testing can deform or even dislodge the BGA balls causing yield loss.

What is needed is an interconnect component that includes contacts that make a temporary non-damaging electrical connection with the external BGA contacts. The interconnect component should provide power, ground and signal paths to the BGA component. A biasing force for biasing the component against the interconnect must be provided that will achieve viable electrical connection, but without damaging the delicate solder ball surfaces.

SUMMARY OF THE INVENTION

The present invention provides an interconnection device for temporary connection of a first electronic system to a second electronic system having a support substrate that includes an ordered array of conductive solder pads. A plurality of coil signal contacts are mounted to the conductive solder pads. Each one of the coil signal contacts comprises a central longitudinal axis, a top turn and a bottom turn that are arranged-in spaced relation to one another. In this way, the bottom turn of one of the plurality of coil signal contacts is fastened to each of the conductive pads such that the top turns are spaced away from the support substrate.

In one alternative embodiment of the invention, an interconnection device for temporary connection of a first electronic system to a second electronic system is provided having a plurality of dual coil signal contacts where each one of the dual coil signal contacts comprises a tail connecting a top coil having a contact turn and a bottom coil having a contact turn. Each of the dual coil contacts is arranged such that the top coil and the bottom coil project outwardly and away from one another. The dual coil contacts are mounted within a support substrate having a top carrier including a first plurality of through-holes, a bottom carrier including a second plurality of through-holes, and a lock-plate including a third plurality of through-holes. The top carrier and the bottom carrier are joined to one another such that the first plurality of through-holes and the second plurality of through-holes are substantially coaxially aligned, and the lock-plate is slideably sandwiched between the top carrier and the bottom carrier. In this way, the lock-plate may slide between (i) a first position wherein the first plurality of through-holes, the second plurality of through-holes, and the third plurality of through-holes are coaxially aligned whereby one of the dual coil signal contacts may be slid through the through-holes so as to be mounted to the substrate; and (ii) a second position wherein only the first plurality of through-holes and the second plurality of through-holes are coaxially aligned and the tail of the dual coil contact is locked within the third through-hole.

In another alternative embodiment of the invention, an interconnection device for temporary connection-of a first electronic system to a second electronic system is provided including a plurality of dual coil signal contacts. Each of the of dual coil signal contacts comprises a top coil having a contact turn, a bottom coil having a contact turn, and a central lock-turn that has a substantially larger diameter than the contact turns. Each of the dual coil contacts are arranged such that the top coil and the bottom coil project outwardly and away from the lock-turn. The dual coil signal contacts are mounted within a support substrate having a top carrier including a plurality of through-holes and a bottom carrier including a plurality of countersunk through-holes. The countersunk through-holes are defined by an annular ledge disposed about a central opening of the through-hole. When a dual coil signal contact is positioned within the bottom carrier of a substrate such that its bottom coil projects outwardly from the countersunk through-hole, the central lock-turn engages the ledge and is locked in place when the top carrier and the bottom carrier are joined to one another.

An electrical connection system is also provided in which a temporary connection is made between an electronic circuit package and an electronic system. In this aspect of the invention, a semiconductor package is provided having a housing with a plurality of solder balls arranged in an array on at least one side. Each of the solder balls comprises a semispherical profile having a center top region spaced away from the housing, and a peripheral edge region that is between the center top region and the housing. An interconnection device is provided having a support substrate including an ordered array of conductive pads. Each one of the signal contacts comprises a central longitudinal axis, a top conductor and a bottom conductor that are arranged in spaced relation to one another. The top conductor is sized so as to engage the substantially semispherical solder ball along the peripheral edge region, and the bottom conductor is fastened to one of the conductive pads.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts and further wherein.

DETAILED DESCRIPTION OF THE PREFERRED EMBODIMENT

This description of preferred embodiments is intended to be read in connection with the accompanying drawings, which are to be considered part of the entire written description of this invention. The drawing figures are not necessarily to scale and certain features of the invention may be shown exaggerated in scale or in somewhat schematic form in the interest of clarity and conciseness. In the description, relative terms such as "horizontal," "vertical," "tup," "down," "top" and "bottom" as well as derivatives thereof (e.g., "horizontally," "downwardly," "upwardly," etc.) should be construed to refer to the orientation as then described or as shown in the drawing figure under discussion. These relative terms are for convenience of description and normally are not intended to require a particular orientation. Terms including "inwardly" versus "outwardly," "longitudinal" versus "lateral" and the like are to be interpreted relative to one another or relative to an axis of elongation, or an axis or center of rotation, as appropriate. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. The term "operatively connected" is such an attachment, coupling or connection that allows the pertinent structures to operate as intended by virtue of that relationship. In the claims, means-plus-function clauses are intended to cover the structures described, suggested, or rendered obvious by the written description or drawings for performing the recited function, including not only structural equivalents but also equivalent structures.

Figure 1:
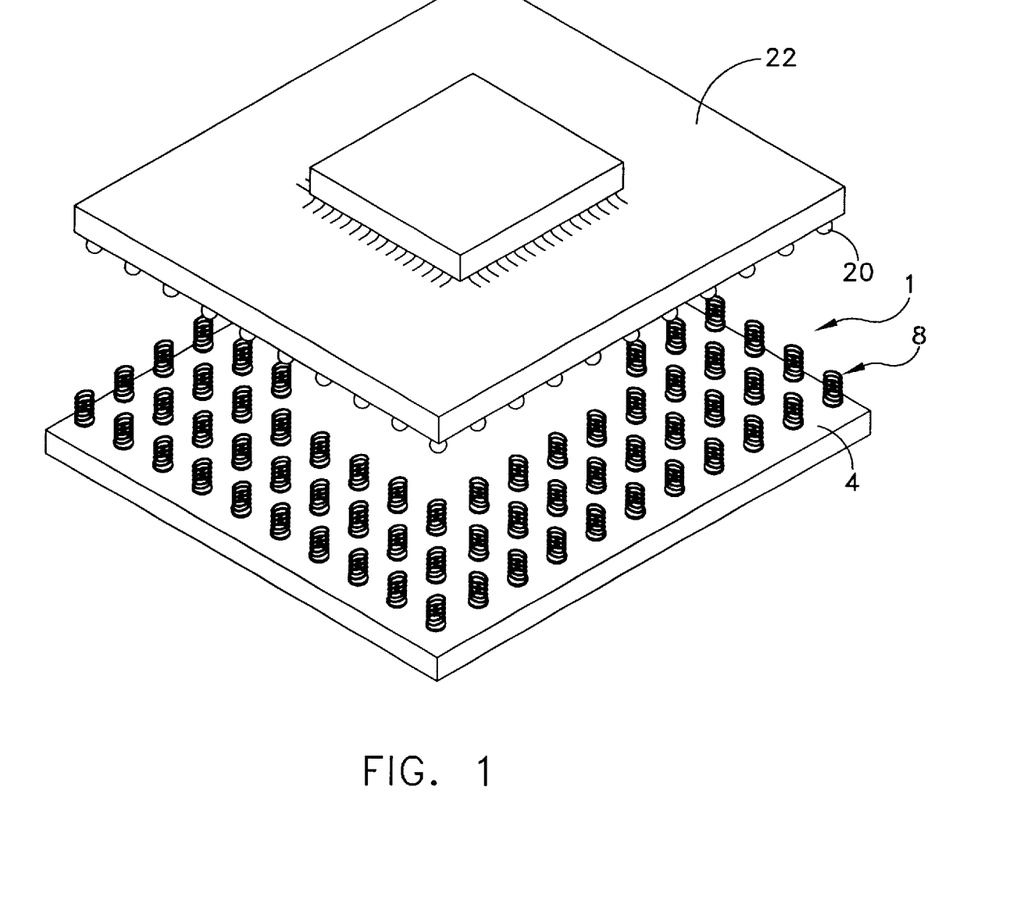
FIG. 1 is a perspective view of a surface mount technology chip carrier positioned above a test and burn-in connector formed in accordance with the present invention.
Figure 2:
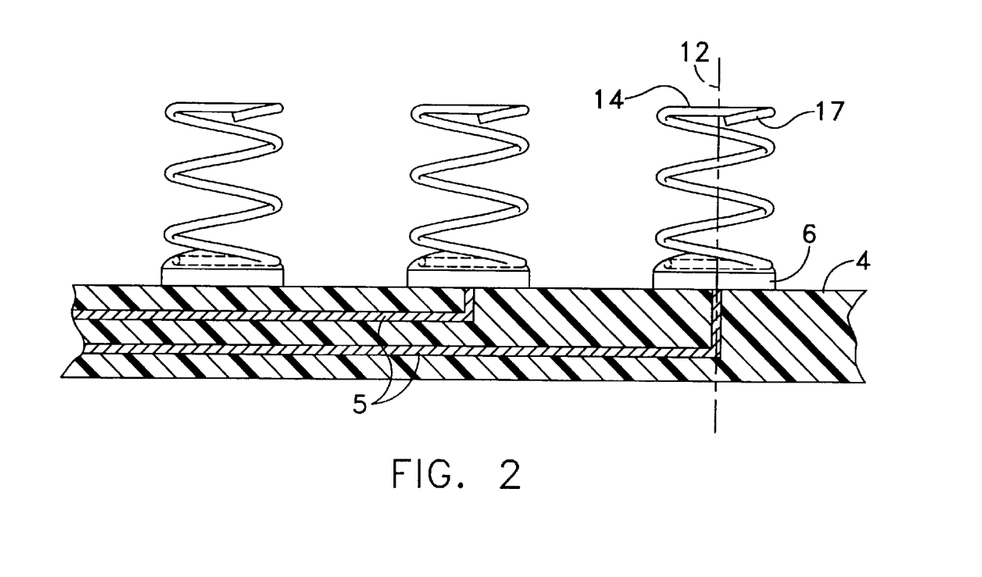
FIG. 2 is a partially broken away, cross-sectional view of the test and burn-in connector shown in FIG. 1, as taken through an arbitrary section of the device.

Referring to FIGS. 1 and 2, a burn-in or test carrier 1 comprises a substrate 4 having a plurality of resilient signal contacts 8 mounted on at least one side. Substrate 4 may be formed from any of the well known dielectric, polymer materials that are suitable for injection molding, and are commonly used in the connector or semiconductor packaging industry, e.g., polyhalo-olefins, polyamides, polyolefins, polystyrenes, polyvinyls, polyacrylates, polymethacrylates, polyesters, polydienes, polyoxides, polyamides and polysulfides and their blends, co-polymers and substituted derivatives thereof. Substrate 4 is generally planer, and may include multiple layers of circuit traces 5 or the like (FIGS. 2 and 3) to facilitate interconnection with a test system (not shown). Also, substrate 4 may include multiple moving parts adapted for releasably locking signal contacts 8 in place, as will hereinafter be disclosed in further detail.

Figure 3:
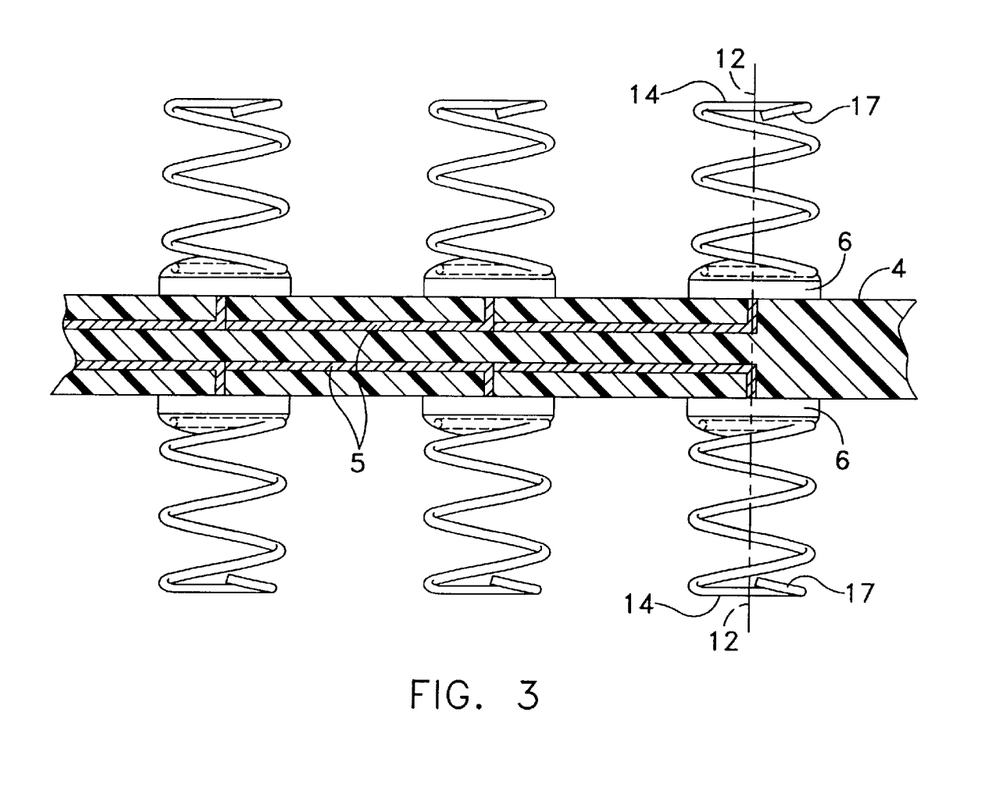
FIG. 3 is a cross-sectional view similar to that shown in FIG. 2, illustrating an alternative embodiment of the present invention.
Figure 4:
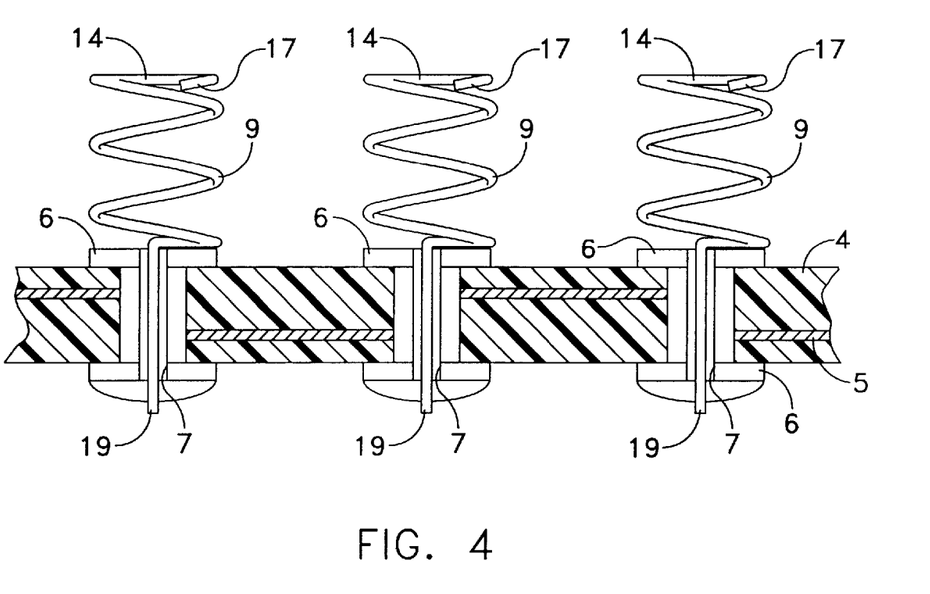
FIG. 4 is a cross-sectional view of the test and burn-in connector of the present invention, similar to FIGS. 2 and 3, showing a through-hole mountable signal contact embodiment of the present invention.

A plurality of solder pads 6 may be formed on one or both sides of substrate 4, so that signal contacts 8 may be surface mounted on one or both sides of substrate 4 (FIGS. 2 and 3). Alternatively, plated-through-holes (PTH) 7 may be defined through substrate 4 for mounting of signal contacts 8 (FIG. 4). Solder pads 6 or PTH 7 are typically in electrical communication with circuit traces 5 so as to complete the required electrical circuits.

Figure 5:
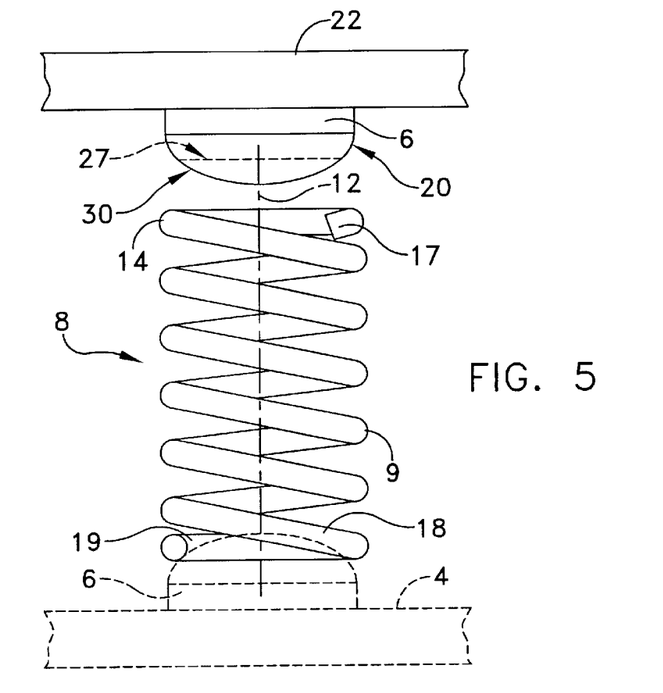
FIG. 5 is a broken-away view, partially in phantom, of the test and burn-in connector of the present invention, showing a signal contact mounted to a solder pad of a substrate and having a top, contact turn just prior to engagement with a solder ball of a surface mount technology ball grid array chip carrier package.
Figure 6:
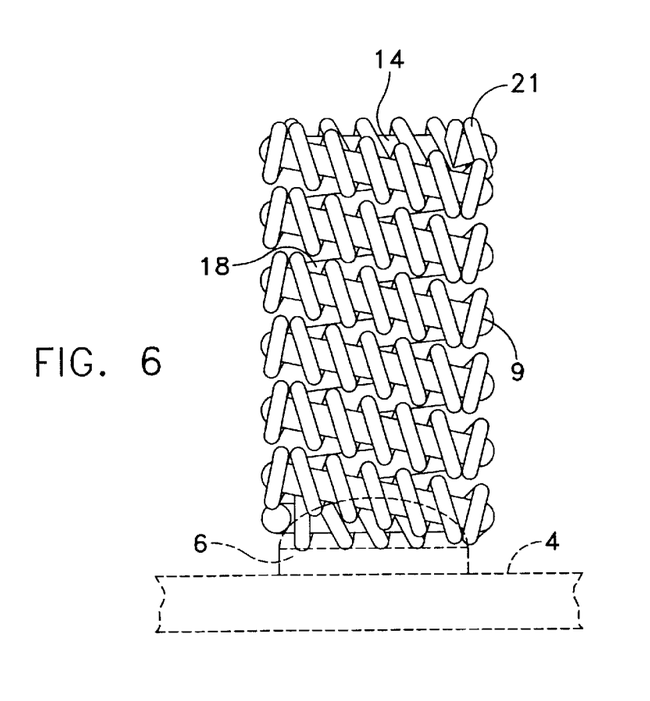
FIG. 6 is a front elevational view, partially in phantom, of an alternative embodiment of the signal contact shown in FIG. 5.
Figure 7:
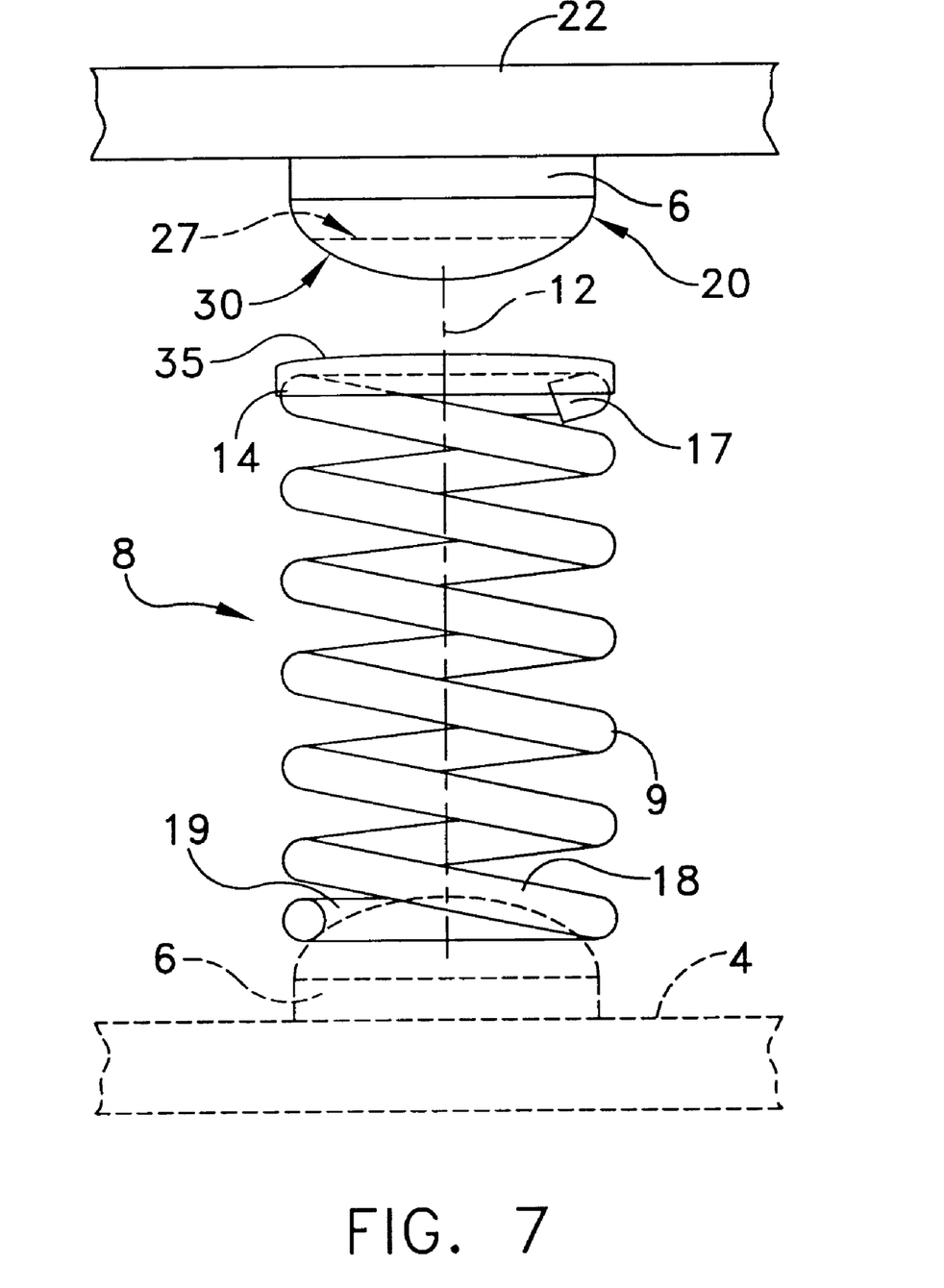
FIG. 7 is a front elevational view, similar to FIG. 5, showing a conductive cap arranged on a signal contact in accordance with a further embodiment of the present invention.

Referring to FIGS. 5–7, signal contacts 8 preferably comprise coiled or helical conductors, that are formed from copper alloys or spring steels. Signal contacts 8 include multiple turns 9 that are disposed about a central longitudinal axis 12, and include a top turn 14 having a free end 17, and a bottom turn 18 having a tail 19. In some embodiments, signal contacts 8 may have a highly conductive tape or soft wire conductor 21 (e.g., gold) wound around one or more turns 9 to enhance electrical engagement with solder ball contacts 20 on a ball grid array (BGA) 22 (FIG. 6). Of course, other area array packages, e.g., solder column grid arrays and tape ball grid arrays, as well as direct chip attach, flip chip connection packaging, chip scale packages, and circuit board contact pads may all be temporarily electrically and mechanically engaged with signal contacts 8.

It is important that no portion of top turn 14 gouge or scratch the surface of solder ball contact 20 during engagement, since this will cause reliability and manufacturing problems during subsequent steps of the manufacturing process. Thus in one embodiment, free end 17 is turned downwardly, or inwardly toward central longitudinal axis 12 of signal contact 8 (FIG. 5). Top turn 14 is preferably arranged so as to be substantially perpendicular to central longitudinal axis 12 thereby providing for a distributed chordal contact with the outer surface of solder ball contact 20. Top turn 14 comprises a diameter that is sized so that a substantially semispherical solder ball contact 20 is engaged along the peripheral edge region 27 that is spaced away from the center top region 30 of semispherical solder ball 20 (FIG. 5). In this way, any scratches that are caused during engagement between signal contacts 8 and solder ball 20, reside in a region that is far from the location of final engagement and soldering of solder ball contact 20. Alternatively, a conductive cap 35 may also be mounted on top turn 14 to further enhance the mechanical and electrical engagement between signal contact 8 and solder ball 20 (FIG. 7).

Figure 8:
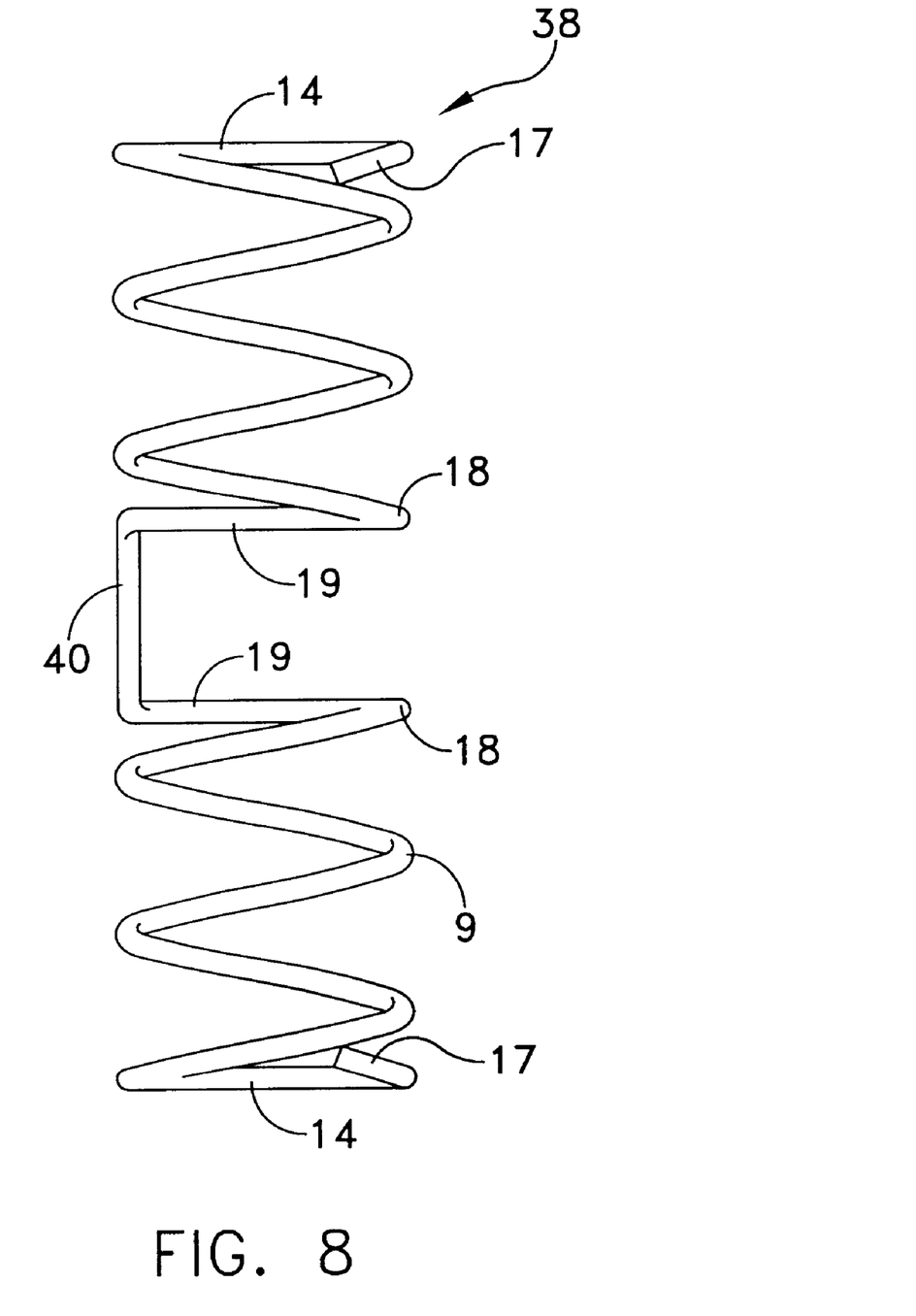
FIG. 8 is a front elevational view of a dual coil signal contact.
Figure 9:
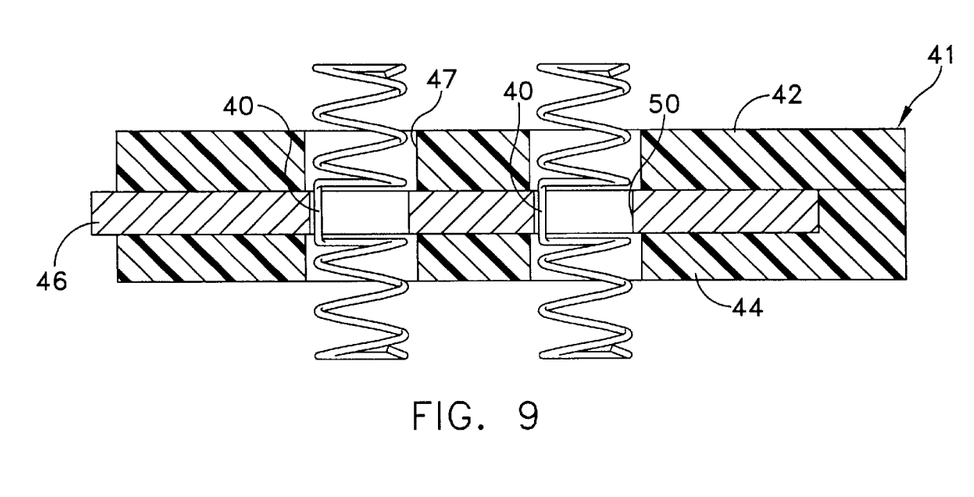
FIGS. 9 and 10 are side cross-sectional views of an alternative embodiment of test and burn-in connector utilizing the dual coil signal contact shown in FIG. 8.
Figure 10:
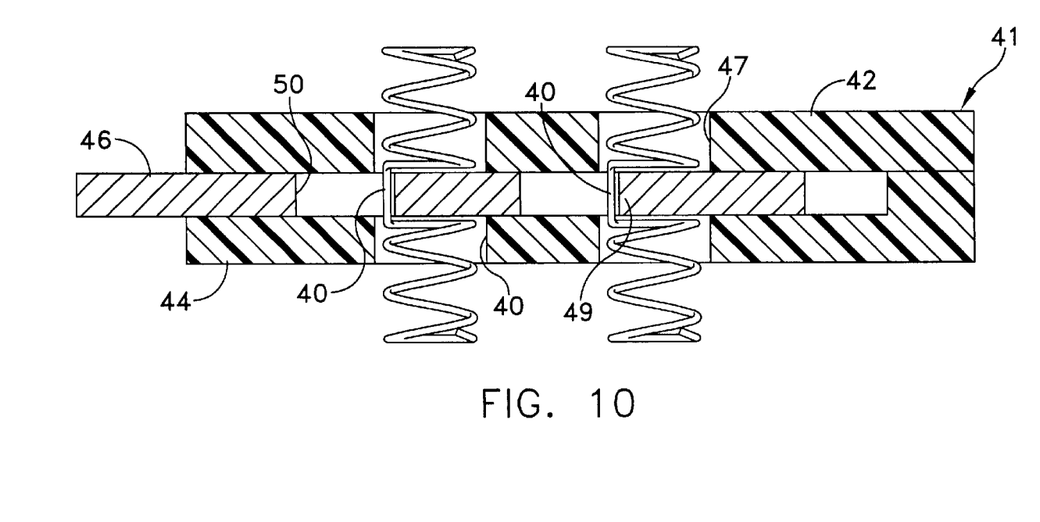

Bottom turn 18 may be formed so as to be substantially parallel to top turn 14 for surface soldering to solder pads 6 on substrate 4 or, tail 19 may project outwardly from bottom turn 18 for insertion into a PTH 7 in substrate 4 (FIGS. 4 and 5). In addition, a dual signal contact 38 may be formed by joining the tails 19 of two signal contacts so as to form a lock-in tail 40 between the them (FIG. 8). Dual signal contact 38 is mounted within a substrate 41 that comprises a top carrier 42, a bottom carrier 44, and a lock-plate 46 that is slideably sandwiched between top carrier 42 and bottom carrier 44 (FIGS. 9 and 10). Substrate 41, like substrate 4, may be formed from any of the well known dielectric, polymer materials that are suitable for injection molding, and are commonly used in the connector or semiconductor packaging industry, e.g., polyhalo-olefins, polyamides, polyolefins, polystyrenes, polyvinyls, polyacrylates, polymethacrylates, polyesters, polydienes, polyoxides, polyamides and polysulfides and their blends, co-polymers and substituted derivatives thereof.

Top carrier 42 and bottom carrier 44 define a plurality of through-holes 47. Top carrier 42 and bottom carrier 44 are assembled to one another such that through-holes 47 are arranged in coaxially aligned relation to one another. Lock-plate 46 is generally planar, and comprises a plurality of elongate through-holes 50, i.e., through-holes that are rectangular or are defined by spaced-apart major and minor axes so as to be oval in shape. To assemble substrate 41, top carrier 42 and bottom carrier 44 are fastened to one another such that lock-plate 46 is slideably received between them, and through-holes 47 and through-holes 50 are arranged in coaxially aligned relation to one another. Once in this position, dual signal contacts 38 are positioned within through-holes 47 and through-holes 50 in substrate 41 (FIG. 9). With dual signal contacts 38 positioned within through-holes 47 and through-holes 50, lock plate 46 is slid relative to top carrier 42 and bottom carrier 44 so that through-holes 50 move relative to through-holes 47 thereby positioning a portion 49 of lock-plate 46 adjacent to lock-in tail 40 of dual contacts 38. Dual signal contacts 38 may be released by reversing the foregoing process.

Figure 11:
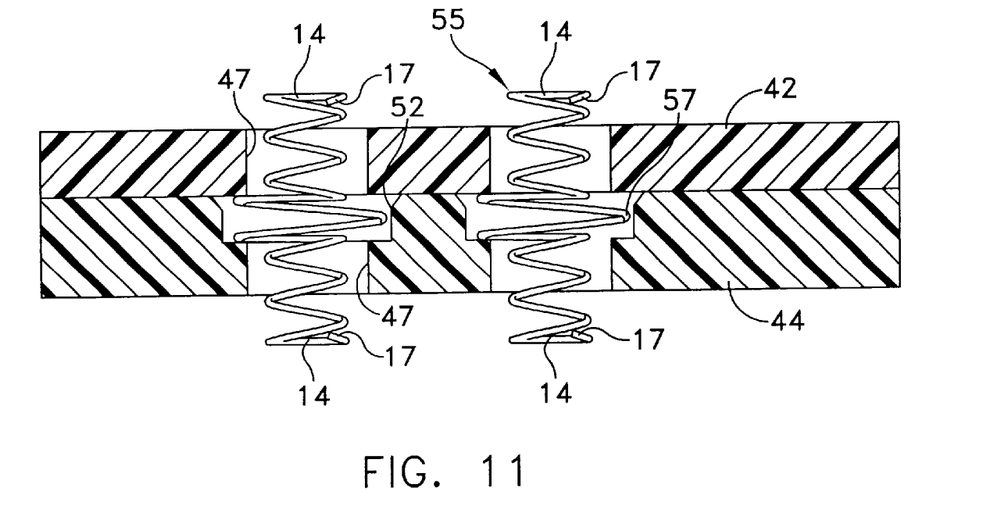
FIG. 11 is an alternative embodiment of substrate comprising a dual coil signal contact having a lock turn.

In a further embodiment of the present invention, bottom carrier 44 includes a counter-sink hole 52 formed at the top of through-hole 47 that is defined by a countersink ledge 53 annularly disposed about the central opening of through-hole 47. A dual signal contact 55 is formed substantially like dual signal contact 38, except that a larger diameter turn 57 is positioned between the coils of the signal contacts. Signal contact 55 is assembled to bottom carrier 44 by inserting a coil through through-hole 47 until turn 57 engages ledge 53 of counter-sink 52. Once in this position, top carrier 42 is assembled over bottom carrier 44 such that the remaining coils project through through-holes 47. Top carrier 42 is then securely fastened to bottom carrier 44.

Figure 12:
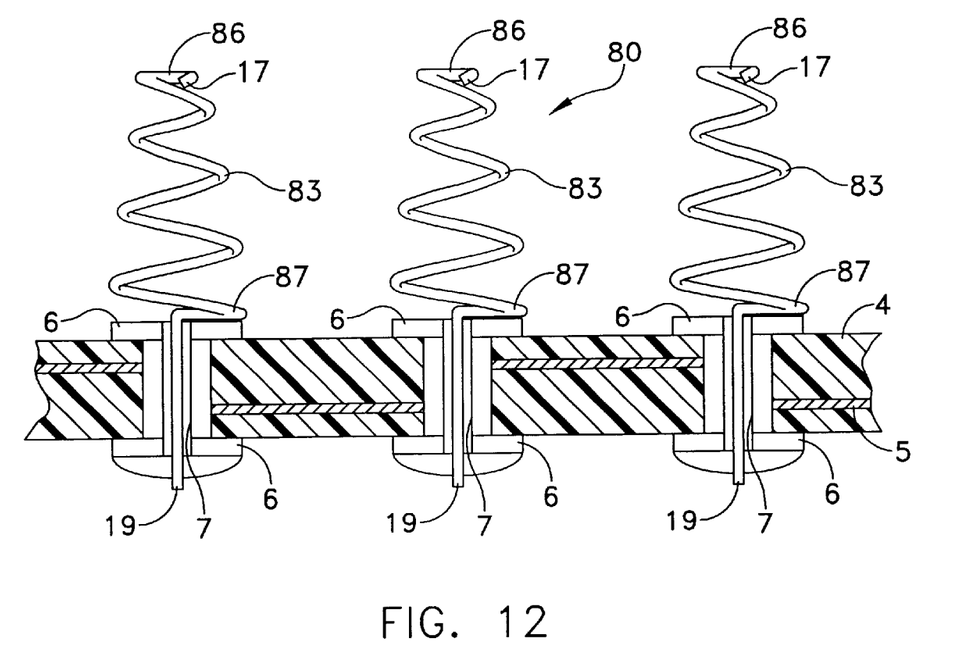
FIG. 12 is a cross-sectional view of an alternative embodiment of the test and burn-in connector of the present invention shown in FIG. 1, as taken through an arbitrary section of the device, illustrating a tapered coil signal contact.
Figure 13:
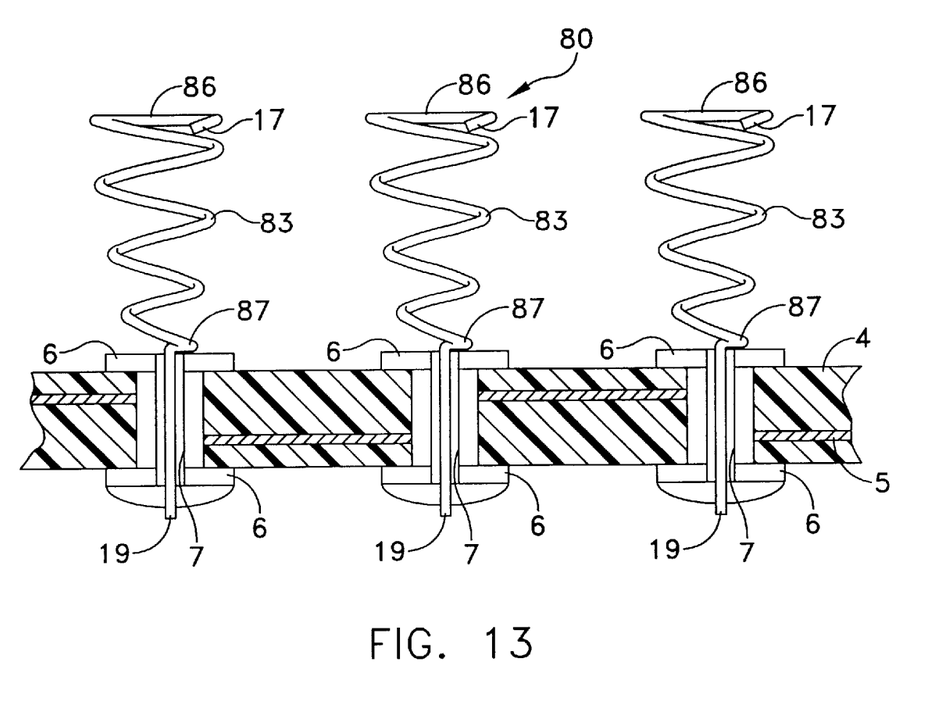
FIG. 13 is a side cross-sectional view of a test and burn-in connector similar to FIG. 12, showing a reverse taper signal contact.

Signal contacts 8 may also be shaped so as to control their effective spring rate. For example, a signal contact 80 may comprise turns 83 of varying diameter, such as would yield a tapered outer profile. In addition, top turn 86 may have a smaller or larger diameter than bottom turn 87 so that signal contact 80 may taper upwardly or downwardly as required.

It is to be understood that the present invention is by no means limited only to the particular constructions herein disclosed and shown in the drawings, but also comprises any modifications or equivalents within the scope of the claims.

What is claimed is:

1. An interconnection device for temporary connection of a first electronic system to a second electronic system comprising:

a plurality of dual coil signal contacts, wherein each one of said dual coil signal contacts comprises a tail connecting a top coil having a contact turn and a bottom coil having a contact turn, each of said dual coil contacts being arranged such that said top coil and said bottom coil project outwardly and away from one another; and     a support substrate having a top carrier including a first plurality of through-holes, a bottom carrier including a second plurality of through-holes, and a lock-plate including a third plurality of through-holes, wherein said top carrier and said bottom carrier are joined to one another such that said first plurality of through-holes and said second plurality of through-holes are substantially coaxially aligned, and said lock-plate is slideably sandwiched between said top carrier and said bottom carrier so that said lock-plate slides between (i) a first position wherein said first plurality of through-holes, said second plurality of through-holes, and said third plurality of through-holes are coaxially aligned whereby one of said dual coil signal contacts may be slid through said through-holes so as to be mounted to said substrate; and (ii) a second position wherein only said first plurality of through-holes and said second plurality of through-holes are coaxially aligned and said tail of said dual coil contact is locked within said third through-hole.

2. An interconnection device according to claim 1 wherein said third through-holes of said lock-plate comprise an elongate shape.

3. An interconnection device according to claim 1 wherein said third through-holes of said lock-plate comprise an oval shape.

4. An interconnection device according to claim 1 wherein said third through-holes of said lock-plate comprise a rectangular shape.

5. An interconnection device according to claim 1 wherein each of said coil signal contacts comprises a helical conductor including multiple turns that are disposed about a central longitudinal axis, and wherein said contact turn includes a free end that is turned downwardly relative to said central longitudinal axis.

6. An interconnection device according to claim 1 wherein each of said coil signal contacts comprises a helical conductor including multiple turns that are disposed about a central longitudinal axis, and wherein said contact turn includes a free end that is turned inwardly toward said central longitudinal axis.

7. An interconnection device according to claim 1 wherein said signal contacts comprise at least one of a conductive tape and wire conductor wound around one or more of said turns.

8. An interconnection device according to claim 1 wherein said contact turn is arranged so as to be substantially perpendicular to said central longitudinal axis.

9. An interconnection device according to claim 1 wherein said contact turn comprises a conductive cap extending the diameter of said signal contact.

10. An interconnection device according to claim 1 wherein said bottom coil is substantially parallel to said contact turn.

11. An interconnection device according to claim 1 wherein a tail projects outwardly from said bottom coil.

12. An interconnection device according to claim 1 wherein said coil signal contacts comprise turns of varying diameter.

13. An interconnection device according to claim 1 wherein said coil signal contacts comprise a tapered outer profile.

14. An interconnection device for temporary connection of a first electronic system to a second electronic system comprising:

a plurality of dual coil signal contacts each comprising a top coil having a contact turn, a bottom coil having a contact turn, and a central lock-turn that comprises a substantially larger diameter than said contact turns wherein each of said dual coil contacts are arranged such that said top coil and said bottom coil project outwardly and away from said lock turn; and a support substrate having a top carrier including a plurality of through-holes and a bottom carrier including a plurality of countersunk through-holes defined by an annular ledge disposed about a central opening of said countersunk through-hole, wherein when a dual coil signal contact is assembled to a bottom carrier such that said bottom coil projects outwardly from said countersunk through-hole, said central lock-turn engages said ledge and is locked in place when said top carrier and said bottom carrier are joined to one another.

* * * * *